(12) United States Patent
Nair et al.

(10) Patent No.: US 7,944,071 B2
(45) Date of Patent: May 17, 2011

(54) METHOD AND DEVICE FOR ENERGY GENERATION

(75) Inventors: Balakrishnan Nair, Sandy, UT (US); Jesse Alan Nachlas, Salt Lake City, UT (US)

(73) Assignee: Oscilla Power Inc., Salt Lake City, UT (US)

( * ) Notice: Subject to any disclaimer, the term of this patent is extended or adjusted under 35 U.S.C. 154(b) by 0 days.

(21) Appl. No.: 12/906,910

(22) Filed: Oct. 18, 2010

(65) Prior Publication Data

US 2011/0068584 A1    Mar. 24, 2011

Related U.S. Application Data

(63) Continuation of application No. 12/618,560, filed on Nov. 13, 2009, now Pat. No. 7,816,799.

(51) Int. Cl.
*F03D 9/00*      (2006.01)
(52) U.S. Cl. .......................................... 290/44; 310/26
(58) Field of Classification Search .................... 290/44, 290/55, 1 R; 416/1, 132 B; 415/4.2, 4.1, 415/4.5, 2.1; 60/398; 310/26
See application file for complete search history.

(56) References Cited

U.S. PATENT DOCUMENTS

| | | | |
|---|---|---|---|
| 4,720,640 A | 1/1988 | Anderson et al. | |
| 5,631,507 A | 5/1997 | Bajric et al. | |
| 6,375,424 B1 | 4/2002 | Scarpa | |
| 6,455,975 B1 | 9/2002 | Raad et al. | |
| 6,911,741 B2 | 6/2005 | Pettersen et al. | |
| 7,116,006 B2 | 10/2006 | McCoin | |
| 7,179,338 B2 | 2/2007 | Guruswamy et al. | |
| 7,816,797 B2 * | 10/2010 | Nair | 290/42 |
| 7,816,799 B2 * | 10/2010 | Nair et al. | 290/44 |
| 7,816,833 B2 * | 10/2010 | Nair | 310/191 |
| 2010/0127582 A1 * | 5/2010 | Nair et al. | 310/26 |
| 2010/0133843 A1 * | 6/2010 | Nair | 290/53 |

FOREIGN PATENT DOCUMENTS

| | | |
|---|---|---|
| WO | 2004/053175 | 6/2004 |
| WO | 2009/055710 | 4/2009 |

OTHER PUBLICATIONS

Berbyuk et al. "Towards Modelling and Design of Magnetostrictive Electric Generators" Computers & Structures, vol. 86, No. 3-5. (Feb. 2008), pp. 307-313.

Zhao et al. "Application of the Villari Effect to Electric Power Harvesting" Journal of Applied Physics, vol. 99, Issue 8, (Apr. 2006), pp. 08M703-08M703-3.

(Continued)

*Primary Examiner* — Julio Gonzalez
(74) *Attorney, Agent, or Firm* — Jeffrey T. Holman

(57) ABSTRACT

A method and device for using magnetostriction to generate electricity from fluid motion. The device includes a first structural component, an outer housing, and a strain structure. The outer housing substantially circumscribes the first structural component and at least partially defines an annular space between the first structural component and the outer housing. The strain structure is coupled within the annular space between the first structural component and the outer housing. The strain structure experiences a change in physical strain imposed by a bearing in response to a relative movement between the bearing and the strain structure. The strain structure includes a magnetostrictive material to generate a magnetic field in response to the change in the physical strain.

20 Claims, 5 Drawing Sheets

OTHER PUBLICATIONS

"Population Trends Along the Coastal United State: 1980-2008" National Oceanic and Atmospheric Administration, (2003), available at: http://oceanservice.noaa.gov/programs/mb/pdfs/coastal_pop_trends_complete.pdf, last accessed Oct. 18, 2010, 54 pages.

JHA "Making Waves: UK Firm harnesses Power of the Sea . . . in Portugal" The Guardian, (Sep. 2008), available at http://www.guardian.co.uk/technology/2008/sep/25/greentech.alternativeenergy, last accessed Oct. 18, 2010, 3 pages.

Ocean Power Technologies Website, available at http://www.oceanpowertechnologies.com/, last accessed Oct. 18, 2010, 1 page.

Non-Final Office Action for U.S. Appl. No. 12/622,637, (May 26, 2010), 8 pages.

* cited by examiner

METHOD AND DEVICE FOR ENERGY GENERATION

CROSS-REFERENCES TO RELATED APPLICATIONS

This application is a continuation of U.S. application Ser. No. 12/618,560, filed Nov. 13, 2009, and entitled "Method and Device for Energy Generation," which is incorporated herein.

BACKGROUND

Embodiments of the invention described herein relate to a method and device for producing electricity by conversion of the mechanical energy of wind or other moving fluids.

Wind power, one of the most promising sources of renewable energy, is starting to be adopted more and more globally. Conventional wind power is based on wind turbines. Conventional wind turbines are rotating machines that convert the kinetic energy in wind into mechanical energy. Wind turbines can be separated into two types based by the axis around which the turbine rotates. Most turbines rotate around a horizontal axis, but some designs have been proposed where the turbine rotates around a vertical axis. Globally, the installed wind capacity was in excess of 120 GW by the end of 2008.

Horizontal axis wind turbines used in commercial wind farms are usually of a three-bladed design. Computer controlled motors orient the blades to face the wind direction. A gear box is commonly used to step up the speed of the generator, although designs may also use direct drive of an annular generator. Some models operate at constant speed, but more energy can be collected by variable-speed turbines which use a solid-state power converter to interface to the transmission system. Most turbines are equipped with shut-down features to avoid damage at high wind speeds.

While wind power adoption has been increasing, there are still issues to be overcome before it can be cost competitive with conventional power on its own merit, without government subsidies or tax credits. One of the issues is the high cost associated with tower height. Due to the inability to harvest sufficient energy at low wind-speeds (i.e., low heights) using conventional designs, the towers need to be very tall as wind speeds are greater at higher altitude. Unfortunately, this requirement can increase the cost of a wind turbine substantially. Transportation of the tall towers and blades can account for up to 20% of the total installed cost of a wind farm. Massive tower construction is required to support the heavy blades, gearbox, and generator. Furthermore, these tall turbines require expensive cranes and skilled operators. Increased tower height also increases maintenance costs as cyclic stress, fatigue and vibration tend to cause failure more frequently in taller turbines. Tower height can even increase public relations costs as taller turbines are likely to increase complaints from residents about damage to their landscape views. Generator designs that allow for a greater conversion efficiency allowing for a similar power rating to be achieved at a smaller tower height/wind speed, therefore, have a commercial advantage.

Another problem with conventional wind-turbines is the technology's low capacity factor. Capacity factor is the ratio of the actual amount of power produced by the wind turbine over time relative to the power that would have been produced if turbine operated at maximum output 100% of the time. The typical capacity factor of a conventional wind turbine is 25-40% as the wind turbine is designed to work only between specific wind-speeds. At low wind-speeds, below the "cut in" speed, the turbine blades do not rotate. At very high wind-speeds they are designed to stop operating for safety reasons. The idle time results in an effectively high cost of energy, and a resulting problem with these types of turbines is that they are typically not used as primary power sources due to the unreliability of the power output. Wind turbine designs that allow for operation across a wider range of wind speeds, which will increase the capacity factor, are therefore beneficial.

One feature of conventional generators that results in a relatively high cut-in speed requirement before significant power is generated by the turbine is the fact that these turbines need a gearbox to convert the low revolutions per minute (typically 0-60 RPM) rotations of the rotor to high RPM rotations of a generator shaft (typically over 1000 RPM). The gearbox results in mechanical energy loss, unacceptable component failure rates, and a relatively high cut-in speed requirement.

Finally, smaller generator designs that have smaller size and weight relative to conventional wind turbines are advantageous because they have lower capital, transportation, installation, and maintenance costs than heavier/bigger generators.

SUMMARY

Embodiments described herein include a method and device for converting the kinetic energy of wind into magnetic and/or electrical energy using novel designs that utilize magnetostrictive elements. Magnetostrictive materials have the property that when a strain is imposed on these materials, it results in a change in magnetization (or flux density) of an associated magnetic field. The phenomenon of magnetostriction has been known for over a century, but the field was really revolutionized by the discovery of giant magnetostrictive (Tb,Dy) alloys for use at cryogenic temperatures in the 1960s. Subsequently, giant magnetostrictive materials that work at room temperature including (Tb,Dy) and Terfenol alloys were developed. (Tb,Dy) and Terfenol-D alloys have saturation strain values as high as $10^{-2}$ (10,000 ppm) and $2\times10^{-3}$ (2000 ppm), respectively, allowing for the development of many practical applications including torque sensors and high precision actuators. Magnetostrictive materials show changes in linear dimensions when a magnetic field is applied (Joule magnetostriction) and a reciprocal effect of changes in the magnetic properties with the application of stress. These characteristics make it possible to use magnetostrictive materials to function as both actuators and as sensors. They are analogous to piezoelectric materials, but have a large operating bandwidth extending to low frequencies, higher energy density, and capability for higher power and force delivery. For certain embodiments of this particular application, magnetostrictive materials are superior to piezoelectric materials due to their greater mechanical durability and lower production cost in high volumes.

Embodiments of the design combine proven concepts from existing technologies such as the basic design of wind-turbines with technology proven on the bench scale for energy generation using magnetostrictive devices to create a new method and device for generating electrical energy from wind. Embodiments of the design are expected to have relatively low capital costs and very good survivability. The device is modular and scalable and capable of delivering up to and over 5 MW of power in a single unit, and over 1 GW of power in a wind farm that have many turbines with such devices installed. Some embodiments may include power management strategies to manage or optimize the delivered power from a suite of these devices.

In a specific embodiment, the device includes a rotating component that rotates around an axis, at least one loading component that revolves around the axis synchronously with the rotating component, and at least one strain structure that experiences a change in physical strain in response to the periodic contact motion of one or more loading components as they revolve around the axis with the rotating component, where the strain structure includes at least one component that contains a magnetostrictive material which also experiences a change in strain and a corresponding change in magnetic field. The change in magnetic field can be used to induce a current/voltage in an electrical conductor, or electrically conductive coil that is in the vicinity of the magnetostrictive material. The device may be incorporated in a wind turbine with a central shaft and a plurality of blades, wherein wind flow over the plurality of blades causes rotation of the central shaft to produce the relative movement between the loading component and the strain structure.

The loading component may be a bearing or an equivalent structure that may be a part of the rotating component, either attached to it or otherwise mechanically coupled to it. The use of the word bearing while describing the embodiments below in no way limits the scope of this invention, and it should be understood that the loads on a strain structure can be created through a variety of designs.

In a specific embodiment, the device includes a first structural component, an outer housing, and a strain structure. The outer housing substantially circumscribes the first structural component and at least partially defines an annular space between the first structural component and the outer housing. The strain structure is coupled within the annular space between the first structural component and the outer housing. The strain structure experiences a change in physical strain imposed by a bearing in response to a relative movement between the bearing and the strain structure. The strain structure includes a magnetostrictive material to generate a magnetic field in response to the change in the physical strain.

Some embodiments described herein implement a generator design that does not need a gear box, can work efficiently at lower wind-speeds and smaller tower heights than conventional wind turbines, and can function across a wider range of wind-speeds or function at higher energy conversion efficiency. Other embodiments of the device for energy conversion are also described.

Embodiments for a method of energy conversion are also described. In one embodiment, the method includes producing an orbital movement of a bearing from a directional flow of fluid. The method also includes generating physical strain on a plurality of strain structures in response to the orbital movement of the bearing. Each strain structure includes a magnetostrictive material oriented in a substantially radial arrangement relative to an orbital path of the bearing. At least a portion of each strain structure is located within the orbital path of the bearing. The method also includes generating a changing magnetic field in response to a change in the physical strain on the strain structure. Other embodiments of the method are also described.

Other aspects and advantages of embodiments of the present invention will become apparent from the following detailed description, taken in conjunction with the accompanying drawings, illustrated by way of example of the principles of the invention.

BRIEF DESCRIPTION OF THE DRAWINGS

Throughout the description, similar reference numbers may be used to identify similar elements.

DETAILED DESCRIPTION

Figure 1:
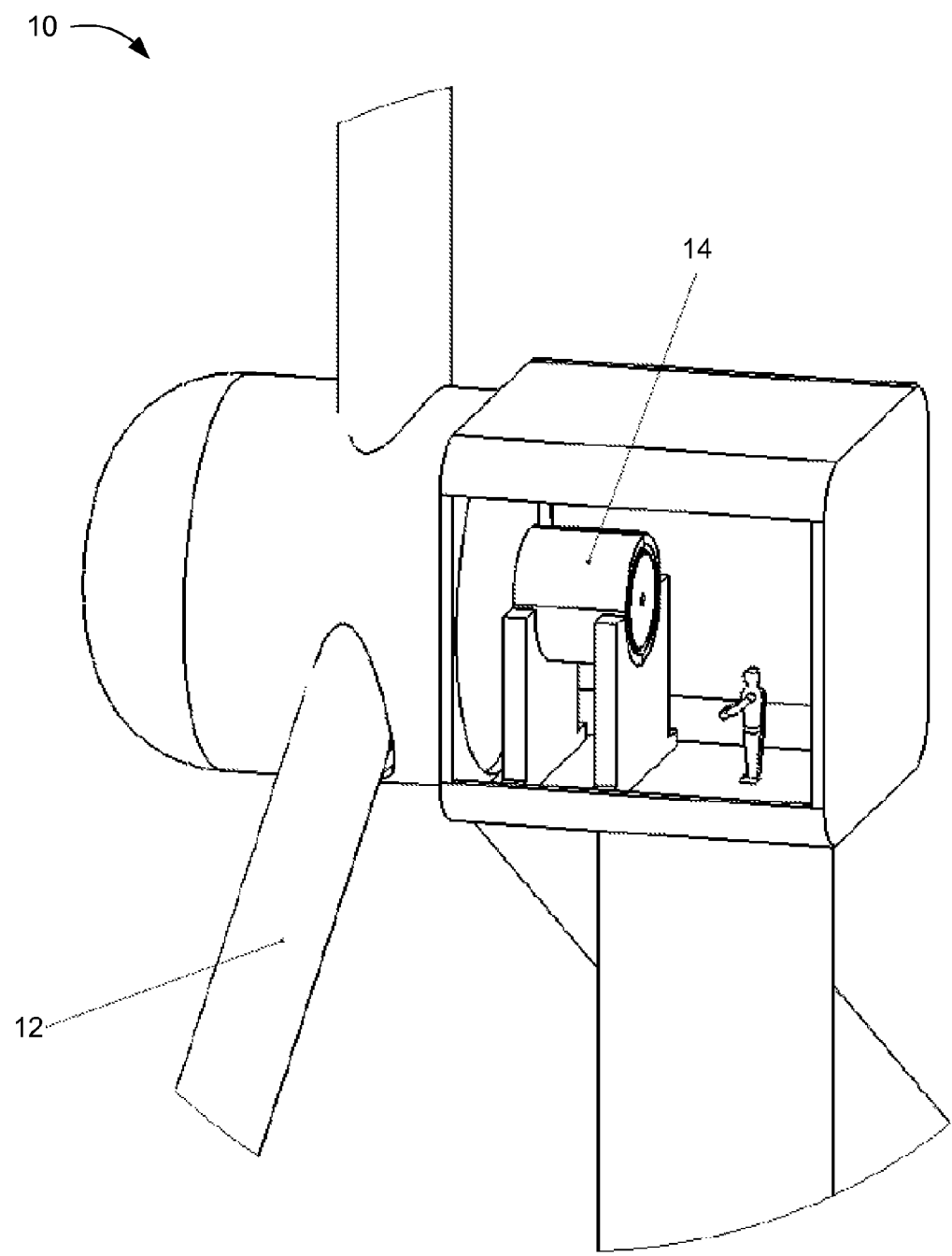
FIG. 1 shows a schematic diagram of one embodiment of a wind turbine system for generating energy using magnetostriction.

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment of the present invention. Thus, the phrases "in one embodiment," "in an embodiment," and similar language throughout this specification may, but do not necessarily, all refer to the same embodiment.

While many embodiments are described herein, at least some embodiments include a method and device to capture the kinetic energy of wind and convert this energy into electrical energy. In this description, references to "wind" refer to any moving gas, and the use of the word "wind" in no way limits the scope or applicability of the invention to the ambient environment or naturally occurring wind alone. For example, it may refer to exhaust gases from vehicles or engines.

In one embodiment, the method includes utilizing the wind, or another moving gas, to cause changes in the strain of one or more magnetostrictive elements. The method also includes using a corresponding change in magnetic field around the magnetostrictive elements to generate an electric voltage and/or electric current in one or more electrically conductive coils or circuits that are in the vicinity of the magnetostrictive elements.

In another embodiment, the method includes utilizing wind, or another moving fluid, to cause motion of one or more rotating components, which in turn result in changes in the strain of one or more magnetostrictive elements to which one or more of the rotating components may be coupled mechanically. The method also includes using a corresponding change in magnetic field around the magnetostrictive elements to generate an electric voltage and/or electric current in one or more electrically conductive coils or circuits that are in the vicinity of the magnetostrictive elements. Thus, as the wind blows, the strain of the magnetostrictive element follows an oscillation or pulse, resulting in a rapidly changing magnetic flux density along the length of the magnetostrictive element. This changing magnetic flux density may be used to generate an induced voltage in a coil wound around the magnetostrictive element (refer to the details in FIGS. 3 and 5) by Faraday's law of induction, which is represented by the following equation:

$$\epsilon = -n(d\phi/dt),$$

where n is the number of turns of the coil, and the term (dφ/dt) is the time derivative of the magnetic flux, φ. Other embodiments of methods for generating electricity are also described.

In one embodiment, the device includes at least one component that is made of, is attached to, comprises of or contains one or more magnetostrictive elements which, is exposed to wind or another moving fluid. The device is designed such that the motion of the wind directly causes changes in the strain of one or more magnetostrictive elements. The device may also include one or more electrically conductive coils or circuits within the vicinity of one or more of the magnetostrictive elements, wherein a corresponding change in magnetic field around the one or more magnetostrictive elements generates an electric voltage and/or electric current in the one or more electrically conductive coils or circuits.

In another embodiment, the device includes a shaft with blades attached to it. The device is deployed in wind or in another moving gas, and designed such that the blades move and rotate the shaft when the wind blows. The device also includes one or more magnetostrictive elements mechanically coupled to or adjacent to the shaft, such that when the shaft rotates it causes strain in one or more magnetostrictive materials. The strain may be caused, for example, by bearings pressing against and releasing one or more of the magnetostrictive elements. The device may also includes electrically conductive coils or circuits within the vicinity of one or more of the magnetostrictive elements, wherein a corresponding change in magnetic field around the magnetostrictive element generates an electric voltage and/or electric current in the electrically conductive coil or circuit. Other embodiments of devices for generating electricity are also described.

Embodiments of the device include one or more of the following components:

1. A support structure that is coupled with blades that when exposed to wind or moving fluid will rotate due to forces applied to the blades by the wind or moving fluid or otherwise caused by the wind or moving fluid.
2. Bearings, rods, or other similar components mechanically coupled to the support structure.
3. A central core that contains at least one, and possibly many, magnetostrictive components of such geometry and arranged in such a fashion so that at least one cross-section of the core has a circular geometry.
4. Electrical coils around or in the vicinity of at least one of the magnetostrictive components of the core.

The support structure is mounted on the core such that the bearings/rods or other components can roll on the surface of the core that has the circular cross-section. The structure is designed such that when the wind blows (or fluid moves) around the blades, the blades cause the support structure to rotate, and the bearings roll on the core that has the magnetostrictive elements such that each bearing/rod applies a load on each magnetostrictive element when they are in contact and the load relaxes as the bearing/rod rolls off. In one example, if there are p bearings and the wind forces the core to rotate at a rate of f rotations per second, then each magnetostrictive element in this design will be stressed and unstressed at a frequency of pf (p multiplied by f) times per second. In one embodiment, the structure is designed such that the load experienced as each bearing passes over is close to the saturation magnetization, and the baseline compressive load experienced by the element is much smaller. The smaller load may be achieved by using bearings/rods of smaller diameters that will apply lower stress.

Some embodiments described herein do not require a shaft/axle that supports the electrical generator. The reduced load carried by the support structure will allow it to turn at lower wind speeds than conventional horizontal axis wind turbines with similar blade geometries at similar wind speeds, thereby increasing the capacity factor significantly.

Examples of engineering improvements that may be achieved by the kind of turbines described herein include, but are not limited to, electronic or mechanical servo-actuated load control between the bearings, designs and materials for the various components that will enhance component life, designs for the core that will improved or maximize the power output, etc. Other embodiments may exhibit additional improvements and/or increased performance.

The structure of the magnetostrictive elements may contain a core-rod of magnetostrictive material that is wound with polymer (e.g., Teflon, PTFE) coated copper wire to the desired number of turns. The selection of the polymer is not critical, except that the polymer should be rated to provide electrical insulation for the highest rated voltage expected in the coil. The wire diameter may be optimized for the intended application, as there is a trade-off between 1) using an increased wire diameter to lower electrical resistance of the coil that allows the delivery or a greater voltage and higher power (lower IR losses) and 2) using a decreased wire diameter to lower the cost and weight of the coil itself. The external sheath can also be of the same or similar material as the polymer coating. Alternatively, the external sheath may be another material to provide corrosion protection of the magnetostrictive rod.

Referring again to the construction of the magnetostrictive elements, other embodiments may use other materials including iron alloys. Fe—Al (Iron-Aluminum), Fe—Cr (Iron-Chromium), and Fe—Si (Iron-Silicon) are known to possess magnetostrictive properties. Other materials may include ductile and low field magnetostrictive alloys based on Fe—Ga, Fe—Mo, and Fe—W. In some embodiments, these alloys are attractive due to their excellent ductility and high magnetostriction values obtained at low applied magnetic fields that are an order of magnitude smaller than that needed for Terfenol-D alloys.

For some applications, however, the saturation magnetostriction is not critical, and several of the Fe-based and Ni-based magnetostrictive materials can be made to work by changing the geometry of the magnetostrictive element for the appropriate expected loading. What may be more critical are factors such as cost and reliability, as these factors directly affect the capital and operating costs of the energy generation device and, therefore, the cost of the delivered energy. The reliability requirement may be divided into a mechanical strength requirement and a corrosion resistance requirement; although the latter may be less critical if appropriate protective jackets, or sheaths, are used to protect the component from rain and humidity and if the operation is in air with low humidity. As a simple comparison of Terfenol-D with alpha-iron-based magnetostrictive alloys (Fe—Ga, Fe—Al, Fe—W, and Fe—Mo), Terfenol-D is an alloy or iron with terbium and Dysprosium ($Tb_{0.3}Dy_{0.7}Fe_{1.9}$). The high alloying levels of the relatively scarce and expensive Tb and Dy makes Terfenol-D very expensive. On the other hand, α-Fe based alloys are relatively inexpensive and robust, and α-Fe based magnetostrictive alloys provide adequate magnetostrictive behavior for this application, in certain embodiments.

The geometry of the individual magnetostrictive elements for any of the embodiments described herein may be defined such that, for the appropriate type of blades or associated impacting components, the expected loads generated for an expected range of wind speeds are near the saturation magnetostriction, so as to reduce or minimize cost of the overall design.

Embodiments described herein are suitable for use with various specific orientations of the turbine (i.e., horizontal axis or vertical axis), as well as specific designs of blades or other associated components.

The specific configurations of the magnetostrictive element and coil in no way limit the type, orientation, structure, or composition of either the magnetostrictive element or the coil. The term magnetostrictive element generally refers to a component or structure, at least a portion of which is constructed of materials possessing magnetostrictive properties. The coil may, without limitation, be wound, suspended, printed, or otherwise attached or located in the vicinity of the magnetostrictive element. For reference, the "vicinity" of the magnetostrictive element refers to any location adjacent to or within the proximity of the magnetostrictive element which allows the coil to sufficiently experience the changing magnetic flux density of the magnetostrictive element so as to result in a measurable potential or current, for example, greater than about 0.01 mV or about 0.01 µA, respectively. More specifically, the vicinity may be limited to distances at which the coil experiences a measurable change in the magnetic flux density of the magnetostrictive element. Since the strength and profile of the changing magnetic flux density may depend on the configuration of the magnetostrictive element, and the sensitivity of the coil may depend on the construction and placement of the coil, the "vicinity" of the magnetostrictive element may vary from one embodiment to another.

The specific configurations of the magnetostrictive elements and coils along with supporting structures, shown and described herein, provide a few examples of ways in which magnetostrictive materials can be utilized as energy generating devices. These examples illustrate that the magnetostrictive materials can be used as energy generating devices by either applying a tensile load, a compressive load, or a combination of both tensile and compressive loads. Energy can be generated by applying a tensile load or compressive load and then releasing it to a no load condition. Alternatively, energy can be generated by applying a tensile load and then passing through a no load condition to a compressive load condition, or vice versa.

For reference, the combination of the magnetostrictive components and the load-bearing components may be referred to as a strain structure. In some embodiments, the accompanying coils or electrical circuits are also considered part of the strain structures.

Thus, the illustrated cylindrical magnetostrictive inner core has several "divisions," each of which includes a magnetostrictive component and a corresponding load-bearing component. In one embodiment, the outer load-bearing components, when assembled with all the other similar components, form a cylindrical/conical or approximately cylindrical/conical outer surface for the inner core. The components of each division may be machined in the shape of pie wedges or any other shape or may themselves be structures composed of several individual magnetostrictive elements and other mechanical fixtures. These divisions may have a mechanism either internally or externally that may be used to pre-stress the corresponding magnetostrictive component. Each magnetostrictive component or group of magnetostrictive components has electrical conductors or electrically conductive coils in their vicinity. Additionally, each magnetostrictive component also may have one or more permanent magnets located internally or externally. The permanent magnets may pre-orient the magnetic domains within the material in a desired direction.

Each bearing is specifically designed to produce a stress state of at least one of the magnetostrictive components when the bearing is aligned with the corresponding load-bearing component. In some embodiments, the contact surface of each load-bearing component is substantially arcuate. When there is no movement between the outer ring and the inner core, the bearings are in contact with the aforementioned cylindrical/conical or approximately cylindrical/conical outer surface of the core. The bearings may be mounted in grooves or receptacles and are located so that the bearings provide a force load to the distal member of the structural support framework that holds the magnetostrictive rods. The number of bearings may be equal to or less than the number of divisions, or load-bearing components. In one embodiment, the number or bearings may be a simple fraction of the number of divisions (e.g., one-half, one-third, two-third, one-fourth, etc). For example, if the number of bearings is half the number of divisions, the bearings will contact the outer surface of every other load-bearing component at a particular time.

The blades of the co-axial energy generator are coupled, for example, to the outer ring or the inner core to convert available energy from various sources (wind, flowing air or gas, steam, water or other fluid, mechanical rotary motion) to a torque that causes relative rotational motion between the outer ring and the inner core. In this way, the bearings roll around the above-defined outer surface of the inner core. Alternatively, the inner core may be configured to rotate in response to the fluid movement, while the outer ring and bearings maintain relatively fixed locations.

In the specific example of a wind turbine, the outer ring may be mechanically coupled to the blades. In this embodiment, the blades used may be conventional blades used in the wind-turbine industry, and the specific type of blades used in no way limits the scope of this embodiment. As the wind blows, the blades will experience lift forces that translate to a torque on the outer ring. This will cause the outer ring to rotate relative to the inner core. As the outer ring completes each revolution relative to the inner core, each of the bearings will roll over each load-bearing component of the inner core. When a bearing is in contact with any particular load-bearing component, the corresponding magnetostrictive component in the division is in a state of stress that is more compressive relative to when the bearing is not in contact with that load-bearing component. For example, if the elements are in a state of tensile pre-stress when the bearing is not in contact with the load-bearing component, then the magnetostrictive components in the division are in a state of lower tensile stress (or zero or compressive stress) when the bearings are in contact with that particular load-bearing component. Conversely, the magnetostrictive component is in a state of higher tensile stress when the bearing is not in contact with that load-bearing component. Since the magnetic domain orientation within each magnetostrictive component is a strong function of the stress state that the magnetostrictive component is under, the change in stress results in a change in magnetic domain orientation, and therefore a change in magnetic field around the element. This change in magnetic field results in an induction current/voltage in a conductive coil or circuit in the vicinity of the magnetostrictive component. The magnetic field generated by each of the magnetostrictive components changes at a frequency in Hz equal to $(N_b)*(r/60)$, where $N_b$ is the number of bearings and r is the revolutions per minute (rpm).

The specific configuration of the bearings and the shape of the core do not limit the scope of this embodiment. For example, instead of a single cylindrical roller bearing, in one embodiment, a number of smaller cylindrical or spherical bearings may be in contact with each load-bearing component. In one embodiment, the bearings are disposed along the circumference of the outer ring or along a direction parallel to the axis of the core.

Other embodiments may be implemented in which the various components between the outer ring and the shaft are rearranged. For example, the bearings may be attached to, in contact with, or adjacent to the inner shaft (e.g., attached to protruding flywheel-type features), and the magnetostrictive components may be attached to, in contact with, or adjacent to the outer ring. Other embodiments may omit the load-bearing components, so the bearings directly contact the magnetostrictive components. Other embodiments may include different shapes and/or configurations of internal components. For example, the contact surfaces of load-bearing components, wherein the bearings contact the load-bearing components during rotational movement, may have different symmetrical or asymmetrical shapes relative to the direction of travel of the bearings relative to the load-bearing components. Furthermore, the bearings may impose either tensile or compression forces, or both, depending on the specific arrangement of the components within a particular embodiment. For example, the bearings and magnetostrictive components may be located on the same side of the load-bearing components, so the bearings impose a tensile force upon rotational movement.

In additional embodiments, the strain imposed by the bearings on the magnetostrictive components can cause the magnetostrictive components to go through various strain stages, including a pre-stressed deformation state, a normal state (not deformed), and a stressed deformation state. Similarly, other embodiments described herein may use different combinations of pre-stressed, normal, and stressed deformation states.

In one embodiment, the pre-stressed deformation state corresponds to an "elongated" deformation and the stressed deformation state corresponds to a "compressed" deformation of the magnetostrictive component. Thus, in one embodiment, the bearings cause the magnetostrictive components to change from the pre-stressed, elongated deformation state to the normal, non-deformed state. Some of the magnetostrictive components may be in the pre-stressed, elongated deformation state, while other magnetostrictive components are in the normal, non-deformed state. In another embodiment, the bearings cause the magnetostrictive components to change from the pre-stressed, elongated deformation state through the normal, non-deformed state, to the stressed, compressed deformation state. In another embodiment, some of the magnetostrictive components may be in the pre-stressed, elongated deformation state, while other magnetostrictive components are in the stressed, compressed deformation state. In another embodiment, the bearings cause the magnetostrictive components to change from the normal, non-deformed state to the stressed, compressed deformation state. In another embodiment, the bearings cause the magnetostrictive components to change from the normal, non-deformed state to the stressed, elongated deformation state.

In contrasting embodiments, the pre-stressed deformation state corresponds to the "compressed" deformation and the stressed deformation state corresponds to the "elongated" deformation of the magnetostrictive component. Thus, the bearings may cause the magnetostrictive components to change from the pre-stressed, compressed deformation state to the normal, non-deformed state. In another embodiment, the bearings cause the magnetostrictive components to change from the pre-stressed, compressed deformation state through the normal, non-deformed state, to the stressed, elongated deformation state. In another embodiment, the bearings cause the magnetostrictive components to change from the normal, non-deformed state to the stressed, elongated deformation state.

The embodiments described herein are illustrated in more detail by way of example in FIGS. 1-5. FIG. 1 shows a schematic diagram of one embodiment of a wind turbine system 10 a wind turbine system for generating energy using magnetostriction. The illustrated energy generation system 10 includes a wind turbine 12 and an energy harvesting device 14. More specifically, FIG. 1 illustrates the relationship between the wind turbine 12 and the energy generating device 14, which includes magnetostrictive rods, coils, and supporting structures, which are described in more detail below with reference to the specific embodiments shown in FIGS. 2-5. In general, FIGS. 2 and 3 refer to a first example embodiments, and FIGS. 4 and 5 refer to a second example embodiment. It should also be noted that, although the example embodiments shown and described herein include certain structural components and corresponding functionality, other embodiments may be implemented using fewer or more components to achieve less or more functionality.

Figure 2:
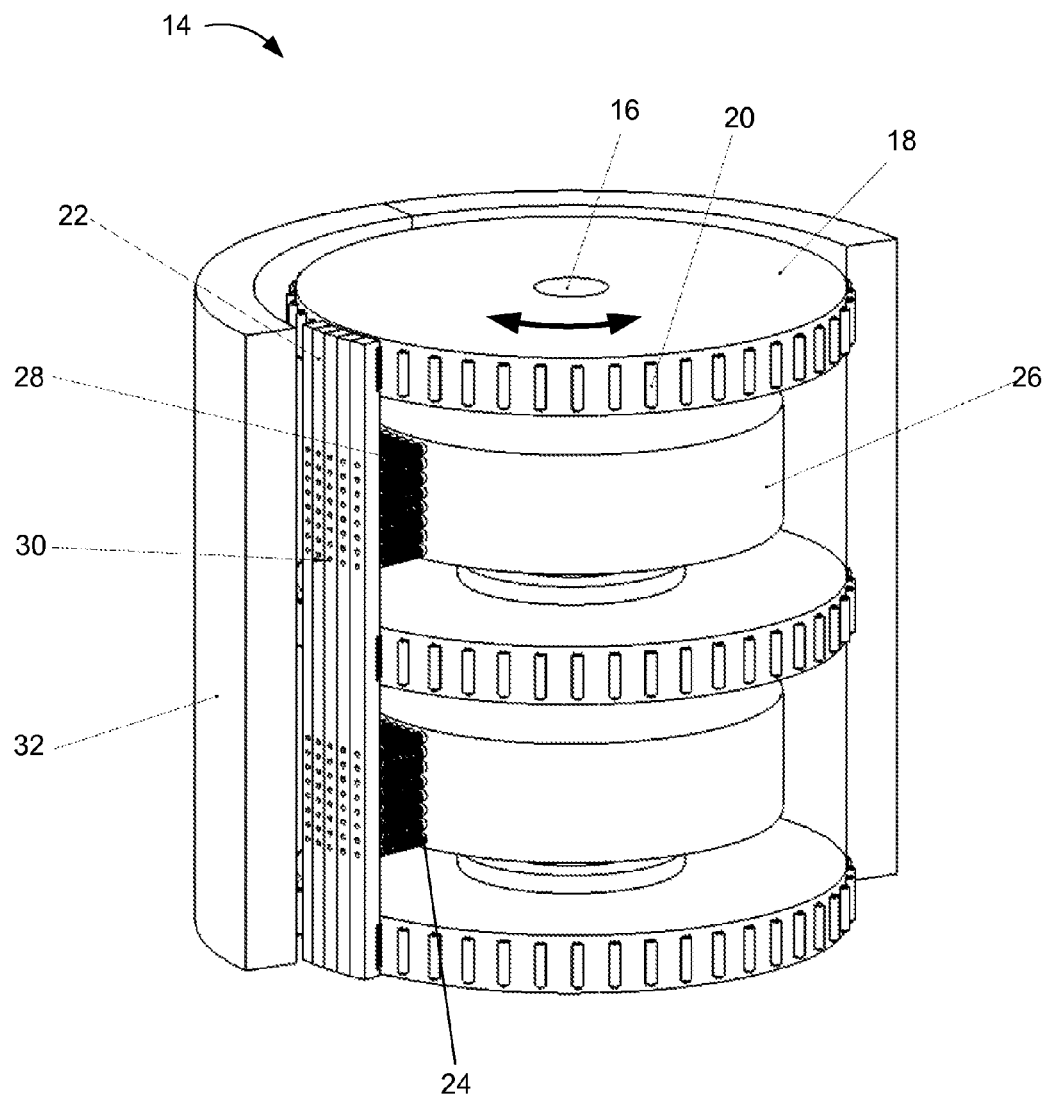
FIG. 2 shows a schematic diagram of one embodiment of the energy generating device of FIG. 1.
Figure 3:
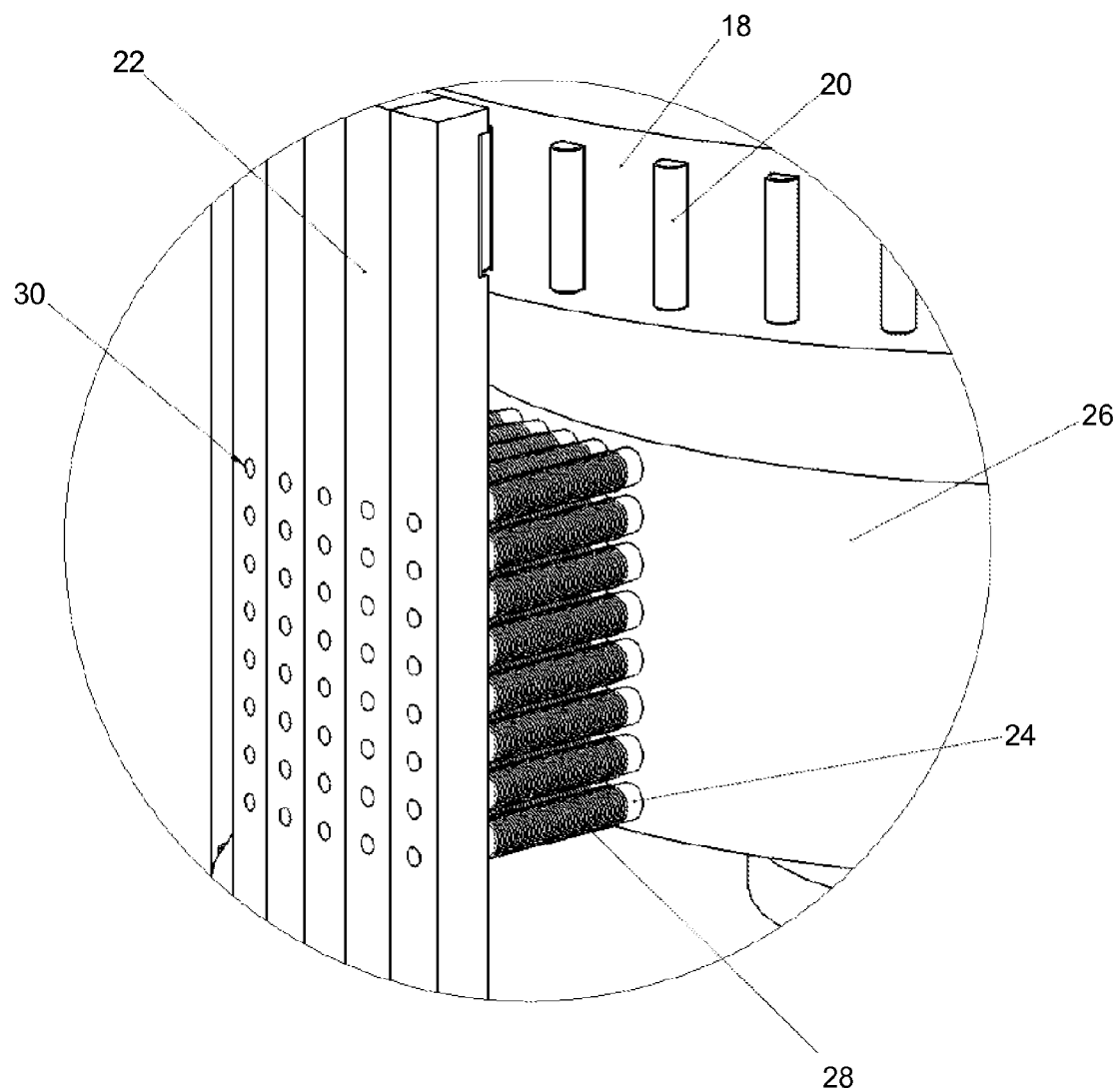
FIG. 3 shows a more detailed illustration of the energy generating device of FIG. 2.

FIG. 2 shows a schematic diagram of one embodiment of the energy generating device 14 of FIG. 1. FIG. 3 shows a more detailed illustration of the energy generating device 14 of FIG. 2. More specifically, these figures show views of one arrangement of the various components of the energy generating device 14 of the wind turbine system 10. The illustrated energy generating device 14 includes a central shaft 16, one or more flywheels 18 coupled to the central shaft 16, and a plurality of bearings 20 coupled to an outer surface of the flywheel 18. The illustrated energy generating device 14 also includes a plurality of stress plates 22 coupled to corresponding groups of energy generating elements 24. In one embodiment, the energy generating elements 24 are magnetostrictive rods, although other embodiments may use other geometric forms of magnetostrictive material. The illustrated energy generating device 14 also includes a support structure 26, electrical circuits or coils 28, fasteners 30, and an outer housing 32.

In this example, the central shaft 16 is connected to the wind blades of the wind turbine 12 which are being driven by the wind causing the shaft 16 to rotate. The rotating shaft 16 is connected to one or more flywheels 18 and causes the flywheels 18 and bearings 20 to rotate within the outer housing 32. As the shaft 16 and flywheels 18 rotate, the bearings 20 come in contact with a portion of the stress plates 22. In this embodiment, the stress plates 22 also may be referred to as tensioning plates, because the force of the bearings 20 on the stress plates 22 causes the magnetostrictive rods 24 to experience a tensile load. Upon further rotation, the bearings 20 roll off of the individual tensioning plates 22, thus releasing the tensile load and returning the corresponding magnetostrictive rods 24 to an unstressed state.

This action of applying and releasing a tensile load to the magnetostrictive rods 24 results in a pulsating magnetic field which is used to induce a voltage in the nearby coils 28. The magnetostrictive rods 24 are firmly coupled between the tensioning plate 22 and the structural component 26, which is concentric and fixed relative to the rotating shaft 16. Hence, as the shaft 16, flywheels 18, and bearings 20 rotate, the magnetostrictive rods 24 are periodically subjected to a tensile load that is applied and released based on contact between the bearings 20 and the stress plates 22. This change in the tensile load on the magnetostrictive rods 24 creates a change in magnetic field, which is converted into electrical energy by the corresponding coils 28.

In one embodiment, during the assembly of the energy generating device 14, one end of the magnetostrictive rods 24 is first connected to the structural component 26. Next, the electrical coils 28 are placed within the vicinity surrounding each magnetostrictive rod 24. Then, the tensioning plates 22 are attached to magnetostrictive rods 24 and fastened into place by the fasteners 30 (e.g., bolts). In one embodiment, each bolt is threaded onto the end of the corresponding magnetostrictive rod 24 to securely hold the tensioning plate 22 in place. Finally, the outer support housing 32 is installed (or the internal components are inserted into the outer housing 32). The outer housing 32 serves as an outer casing environmental barrier as well as part of the support that connects to the inner concentric support member 26, via connecting support rods or other structures (not shown).

Figure 4:
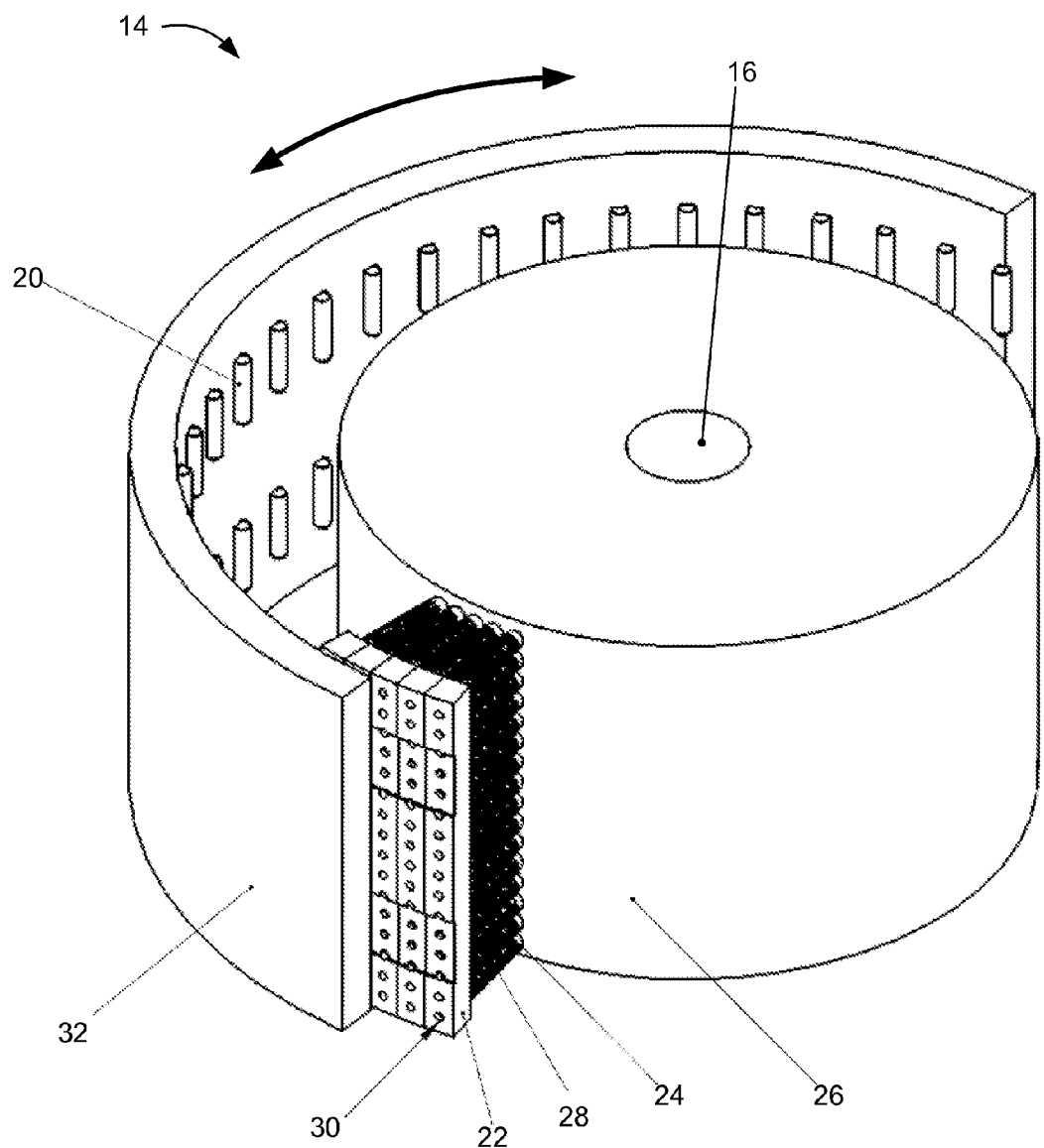
FIG. 4 shows a schematic diagram of another embodiment of the energy generating device of FIG. 1.
Figure 5:
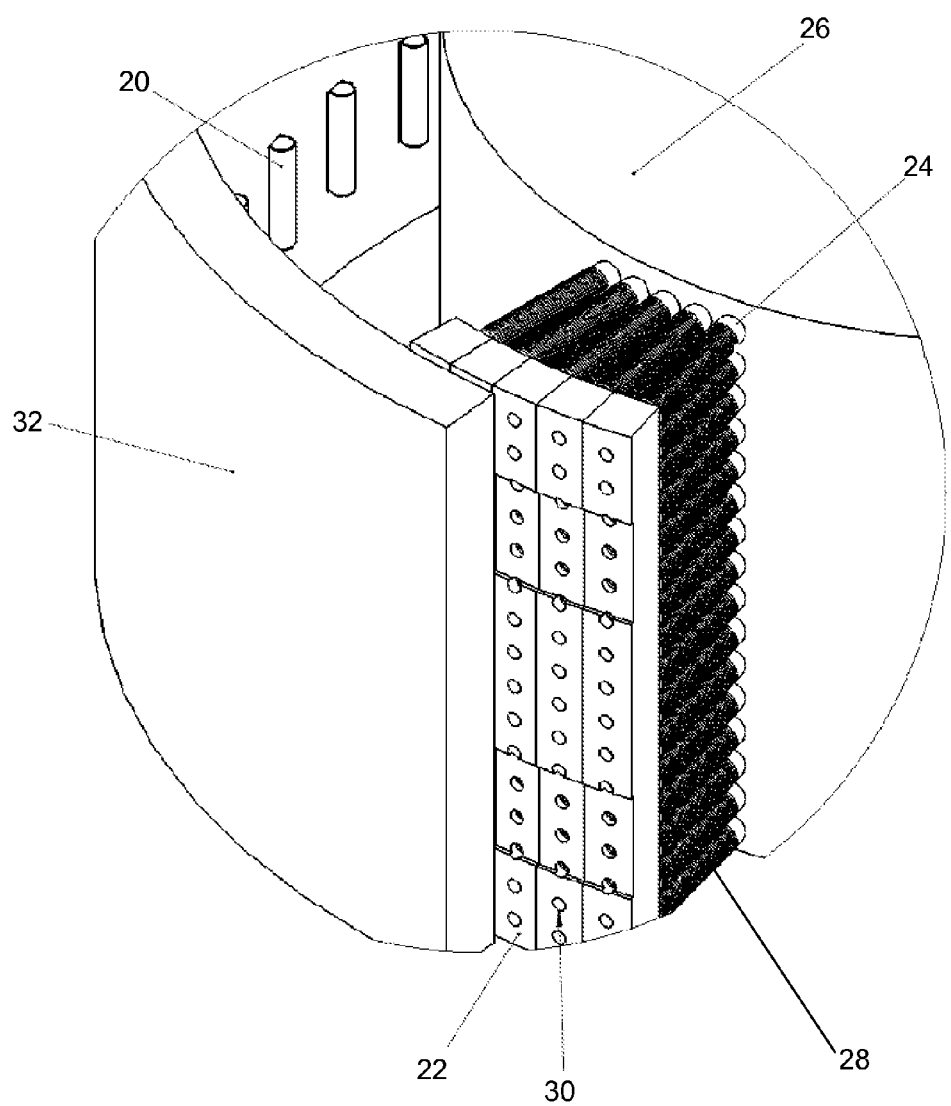
FIG. 5 shows a more detailed illustration of the energy generating device of FIG. 4.

FIG. 4 shows a schematic diagram of another embodiment of the energy generating device 14 of FIG. 1. FIG. 5 shows a more detailed illustration of the energy generating device 14 of FIG. 4. More specifically, these figures show views of a view of another arrangement of the components of the energy generating device 14 of the wind turbine system 10. Except for the flywheels 18, this embodiment has many of the same or similar components as described above.

In this example, the magnetostrictive rods 24 are subjected to a compressive load, rather than a tensile load. The compressive load is applied and released by the bearings 18 to create the changes in magnetic field. In one embodiment, the central support structure 26 is fixed in place and does not move, even thought the shaft 16 rotates within the support structure 26. Thus, the support structure 26 forms part of the structural support system that holds the magnetostrictive rods 24 in a fixed location. The other end of the magnetostrictive rods 24 is held in place by a load transferring stress plate 22, similar to the stress plate described above. However, the stress plate 22 in FIGS. 4 and 5 may be referred to as a compression plate, because the force of the bearings 20 on the stress plates 22 causes the magnetostrictive rods 24 to experience a compressive load. In one embodiment, the compression plates 22 are fastened to the magnetostrictive rods 22 in a similar fashion by inserting a bolt 15 through the compression plate 22 which threads into an individual corresponding magnetostrictive rod 24.

The compressive force load is transferred to the compression plate 22 by way of the bearings 20 which are mounted to an inner surface of the outer housing 32. The outer housing 32 is connected, in this case, to the wind blades which are being driven by the wind. Hence, the outer housing 32 rotates, which in turn provides the pulsating compressive force to the compression plates 22 and the magnetostrictive rods 24. The pulsating compressive force being is transferred through the compression plates 22 to result in an oscillating magnetic field which induces a voltage in the conductive coil 28 near the corresponding magnetostrictive rods 24.

In a further embodiment, the energy generating device 14 may include components with bearings 20 arranged on both sides of a stress plate 22. For example, one embodiment of the energy generating device 14 may implement bearings 20 on an internal flywheel 16, as shown in FIGS. 2 and 3, in addition to bearings 20 on an inner surface of the outer housing 32, as shown in FIGS. 4 and 5.

The bearings 20 may be arranged to alternately impact the stress plate 22 and produce alternating tensile and compressive loads on the magnetostrictive rods 24. In this way, the magnetostrictive rods 24 may experience a full range of stress loads as the magnetostrictive rods 24 experience different states, including compressed, non-deformed, and elongated.

Various types of lubricant may be used with the bearings to lower the cut-in speed, to reduce the torque needed to achieve a certain rpm, and/or to increase the usable life of the bearings. The use of or type of lubricants in no way limits the scope of this embodiment.

Various types of cooling systems may be used to prevent over heating of the induction coils including air and water cooling. The use of or type of cooling systems in no way limits the scope of this embodiment.

The outputs from the various magnetostrictive elements may be electrically or electronically coupled in various forms to generate a desirable output voltage/current characteristic. For example, the outputs from all the elements that are in contact with bearings at a particular time can be coupled in electrical series to generate a high-voltage A/C output. The use of electrical connections or power electronics to process the electrical output in a desired fashion in no way limits the scope of this embodiment.

It is anticipated that several of the embodiments described herein are capable of providing outputs as may be desirable to specific utilities or consumers such as different frequencies, output voltages, AC/DC current characteristics, etc. by either changing the number, type and/or configuration of magnetostrictive elements or through electrical design modifications. For example, outputs from individual magnetostrictive elements may be changed by changing the number of coils. Frequencies may be changed by changing the number of magnetostrictive elements, and the "phase" may be changed by changing the pitch or spacing (linear or angular) of the magnetostrictive elements.

It should be noted that the technology described herein is clean and creates electricity from wind without consuming any carbonaceous fuels or generating any harmful pollutants. The substitution of the energy generated by embodiments described herein may reduce green house gases and pollutants, compared with fossil fuels, without undesirable side-effects or compromises.

At least some of the embodiments described herein result in higher energy conversion efficiency and/or delivered power at lower wind-speeds than conventional wind turbines. Also, coupling or combining portions of one or more of the embodiments described herein with conventional turbines can result in greater efficiency, greater delivered power, a wider operating window of wind speeds and/or a greater capacity factor than conventional wind turbines.

In some embodiments, power electronics are implemented to convert the electrical energy output from the embodiments described herein. The power electronics also may condition or modify the electrical energy and feed the conditioned power to a target energy consuming device/structure or electricity grid. The specific type or configuration of the power electronics in no way limits the scope of this invention. The energy consuming device may be a machine, building, vehicle, etc. The specific energy consuming device/structure or the specific nature of the electricity grid that the power is fed to does not in any way limit the scope of this invention.

Additionally, some of the embodiments described herein may be applicable to generating energy from other moving fluids.

In the above description, specific details of various embodiments are provided. However, some embodiments may be practiced with less than all of these specific details. Although the operations of the method(s) herein are shown and/or described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner. Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A device for energy conversion, the device comprising:
a first structural component;
an outer housing to substantially circumscribe the first structural component and to at least partially define an annular space between the first structural component and the outer housing;
at least one strain structure coupled within the annular space between the first structural component and the outer housing, wherein the at least one strain structure is configured to experience a change in physical strain imposed by at least one rolling bearing in response to a relative movement between the at least one rolling bearing and the at least one strain structure, wherein the at least one strain structure comprises a magnetostrictive material to generate a magnetic field in response to the change in the physical strain, and wherein the number of rolling bearings is less than or equal to the number of strain structures.

2. The device of claim 1, further comprising an electrical circuit proximate to the magnetostrictive material, wherein the electrical circuit is configured to generate an inductive electric charge in response to the magnetic field generated by the magnetostrictive material.

3. The device of claim 2, wherein the magnetostrictive material comprises a magnetostrictive rod, and the electrical circuit comprises a coil of conductive material looped around the magnetostrictive rod.

4. The device of claim 1, further comprising a wind turbine with a central shaft and a plurality of blades, wherein wind flow over the plurality of blades causes rotation of the central shaft to produce the relative movement between the at least one rolling bearing and the at least one strain structure.

5. The device of claim 4, further comprising a flywheel coupled to the central shaft of the wind turbine, wherein the at least one rolling bearing is disposed on an outer surface of the flywheel, and the rotation of the central shaft causes rotation of the flywheel and orbital revolution of the at least one rolling bearing about an axis of the central shaft.

6. The device of claim 5, wherein:
the first structural component is centered about the axis of the central shaft;
the magnetostrictive material of the strain structure is coupled to the first structural component;
a stress plate is coupled to a distal end of the magnetostrictive material; and
the orbital revolution of the at least one rolling bearing results in impact on the stress plate and a tensile load on the magnetostrictive material to elongate the magnetostrictive material during the impact of the at least one rolling bearing on the stress plate.

7. The device of claim 5, wherein:
the magnetostrictive material of the strain structure is coupled to the outer housing;
a stress plate is coupled to a distal end of the magnetostrictive material; and
the orbital revolution of the at least one rolling bearing results in impact on the stress plate and a compressive load on the magnetostrictive material to compress the magnetostrictive material during the impact of the at least one rolling bearing on the stress plate.

8. The device of claim 4, wherein the at least one rolling bearing is disposed on an inner surface of the outer housing, and the rotation of the central shaft causes rotation of the outer housing and orbital revolution of the at least one rolling bearing about an axis of the central shaft.

9. The device of claim 8, wherein:
the first structural component is centered about the axis of the central shaft;
the magnetostrictive material of the strain structure is coupled to the first structural component;
a stress plate is coupled to a distal end of the magnetostrictive material; and
the orbital revolution of the at least one rolling bearing results in impact on the stress plate and a compressive load on the magnetostrictive material to compress the magnetostrictive material during the impact of the at least one rolling bearing on the stress plate.

10. The device of claim 4, wherein the at least one rolling bearing is disposed on an outer surface of the first structural component, and the rotation of the central shaft causes rotation of the first structural component and orbital revolution of the at least one rolling bearing about an axis of the central shaft.

11. The device of claim 10, wherein:
the first structural component is centered about the axis of the central shaft;
the magnetostrictive material of the strain structure is coupled to the outer housing;
a stress plate is coupled to a distal end of the magnetostrictive material; and the orbital revolution of the at least one rolling bearing results in impact on the stress plate and a compressive load on the magnetostrictive material to compress the magnetostrictive material during the impact of the at least one rolling bearing on the stress plate.

12. The device of claim 1, wherein the relative movement between the at least one rolling bearing and the at least one strain structure results in an impact between the at least one rolling bearing and at least a portion of the at least one strain structure, which causes the magnetostrictive material to experience at least two of the following deformation states:
   a compressed deformation state;
   a normal, non-deformed state; and
   an elongated deformation state.

13. The device of claim 1, further comprising:
   a plurality of strain structures co-axially disposed within the annular space between the first structural component and the outer housing, wherein each strain structure comprises a magnetostrictive rod;
   a plurality of stress plates coupled to distinct groups of the magnetostrictive rods, wherein each stress plate is located at a unique rotational angle and along a common orbital path; and
   a plurality of rolling bearings located along an orbital path that at least partially overlaps with the common orbital path of the plurality of stress plates;
   wherein each rolling bearing is configured to sequentially impact each of the stress plates during relative rotational movement between the rolling bearings and the stress plates.

14. A method for converting energy, the method comprising:
   producing an orbital movement of at least one rolling bearing from a directional flow of fluid;
   generating physical strain on a plurality of strain structures in response to the orbital movement of the at least one rolling bearing, wherein each strain structure comprises a magnetostrictive material oriented in a substantially radial arrangement relative to an orbital path of the at least one rolling bearing, and at least a portion of each strain structure is located within the orbital path of the rolling bearing, wherein the number of rolling bearings is less than or equal to the number of strain structures; and
   generating a changing magnetic field in response to a change in the physical strain on the strain structure.

15. The method of claim 14, further comprising:
   inducing an electrical charge within an electrical circuit proximate to the magnetostrictive material of each strain structure in response to the changing magnetic field; and
   transmitting an electrical voltage from the induced electrical charge.

16. The method of claim 14, wherein producing the orbital movement comprises producing a rotational movement of a turbine, wherein the method further comprises:
   impacting the at least one rolling bearing on the strain structure within an outer housing of the turbine with each revolution of the turbine, wherein the impact from the at least one rolling bearing on the strain structure causes the magnetostrictive material to experience at least two separate deformation states, selected from a group consisting of:
   a compressed deformation state;
   a normal, non-deformed state; and
   an elongated deformation state.

17. The method of claim 14, wherein producing the orbital movement comprises producing a rotational movement of a wind turbine, wherein the method further comprises:
   impacting a plurality of rolling bearings on the plurality of strain structures within the turbine with each revolution of the wind turbine, wherein the strain structures are sub-divided into at least two sub-sets based on the timing of the impact of the rolling bearings on the strain structures; and
   combining induced electrical charges from sub-sets of the strain structures as the rolling bearings impact each sub-set of strain structures.

18. The method of claim 14, wherein the strain structure further comprises a stress plates coupled to a distal end of the magnetostrictive material, wherein the method further comprises impacting the at least one rolling bearing on the stress plates of the strain structures within the wind turbine with each revolution of the wind turbine.

19. A device for energy conversion, the device comprising:
   a rotating component that rotates around an axis;
   at least one rolling loading component that revolves around the axis synchronously with the rotating component; and
   at least one strain structure that experiences a change in physical strain in response to periodic contact motion of the at least one rolling loading component during revolution around the axis with the rotating component, wherein the at least one strain structure is arranged in a substantially stationary location so that there is relative motion of the at least one rolling loading component to pass by the substantially stationary location of the at least one strain structure, and wherein the number of rolling load components is less than or equal to the number of strain structures;
   wherein the strain structure comprises at least one component that contains a magnetostrictive material which also experiences a change in strain and a corresponding change in magnetic field to induce electrical current and/or voltage in an electrical conductor that is in a vicinity of the magnetostrictive material.

20. The device of claim 19, further comprising a wind turbine with a central shaft and a plurality of blades, wherein wind flow over the plurality of blades causes rotation of the central shaft to produce the relative movement between the at least one rolling loading component and the at least one strain structure.

* * * * *